United States Patent [19]
Jiang et al.

[11] Patent Number: 6,017,776
[45] Date of Patent: Jan. 25, 2000

[54] METHOD OF ATTACHING A LEADFRAME TO SINGULATED SEMICONDUCTOR DICE

[75] Inventors: Tongbi Jiang; Syed S. Ahmad, both of Boise; Walter L. Moden, Meridian, all of Id.

[73] Assignee: Micron Technology, Inc., Boise, Id.

[21] Appl. No.: 08/840,403

[22] Filed: Apr. 29, 1997

[51] Int. Cl.[7] ............ H01L 21/44; H01L 21/48; H01L 21/50

[52] U.S. Cl. .............. 438/118; 438/11; 438/14; 438/15; 438/18; 438/111; 438/113; 438/123; 438/460

[58] Field of Search .................. 438/111, 113, 438/118, 123, 460, FOR 340, FOR 343, FOR 351, FOR 354, FOR 360, 14, 11, 15, 18, FOR 101, FOR 142

[56] References Cited

U.S. PATENT DOCUMENTS

| | | | |
|---|---|---|---|
| 4,862,245 | 8/1989 | Pashby et al. | |
| 5,139,973 | 8/1992 | Nagy et al. | 437/211 |
| 5,208,188 | 5/1993 | Newman | 437/220 |
| 5,221,642 | 6/1993 | Burns | 437/207 |
| 5,286,679 | 2/1994 | Farnworth et al. | 437/209 |
| 5,579,573 | 12/1996 | Baker et al. | 29/840 |
| 5,681,757 | 10/1997 | Hayes | 437/7 |
| 5,683,944 | 11/1997 | Joiner et al. | 437/220 |
| 5,776,799 | 7/1998 | Song et al. | 438/118 |

*Primary Examiner*—John F. Niebling
*Assistant Examiner*—David A. Zarneke
*Attorney, Agent, or Firm*—Trask, Britt & Rossa

[57] ABSTRACT

The present invention is directed to a method of attaching a leadframe to a singulated good die using a wet film adhesive applied in a predetermined pattern on the active surface of the good die, the lead finger of a leadframe, or both. By applying the adhesive only to identified good dice, time and material are saved over a process that applies adhesive to the entire wafer. By attaching the leadframe to the good die with a wet film, it is possible to remove the leadframe from the good die for rework if the good die subsequently tests unacceptable.

56 Claims, 2 Drawing Sheets

METHOD OF ATTACHING A LEADFRAME TO SINGULATED SEMICONDUCTOR DICE

BACKGROUND OF THE INVENTION

1. Field of the Invention

The present invention relates to semiconductor device packaging. More particularly, the present invention relates to a method for attaching a singulated good die, determined to be a good die by the probe testing thereof while in wafer form, not to be confused with known-good-die (KGD) which is a die known to be good after the burn-in and testing thereof, to a leadframe by applying a liquid or paste mixture of unreacted monomers or polymers or a diluted resin deposited in a predetermined pattern on the active surface of the semiconductor device, the leadframe, or both, after the die has been separated from the wafer and probe tested.

2. State of the Art

Well known types of semiconductor devices are connected to components, typically a leadframe, and subsequently encapsulated in thermo-setting plastic materials for use in a wide variety of applications. A conventional type leadframe is typically formed from a single, continuous sheet of metal, typically using metal stamping operations. The leadframe includes an outer supporting frame, a central semiconductor device supporting pad (die paddle) and a plurality of lead fingers, each lead finger having, in turn, a terminal bonding portion near the die paddle on which the semiconductor device is located. Ultimately, the outer supporting frame portions of the leadframe are removed after wire bonds are connected between the contact pads of the semiconductor device and the lead fingers of the leadframe and the encapsulation of the semiconductor device and portions of the lead fingers.

In the assembly of semiconductor devices utilizing such leadframes, a semiconductor device is secured to the die paddle (such as by a solder or epoxy die-attach material, although a double-sided adhesive tape has also been suggested in the art) and then the entire leadframe, with the semiconductor device thereon, is placed into a wire bonding apparatus including a clamp assembly for holding the leadframe and semiconductor device assembly, and clamping the lead fingers for bonding.

In a standard wire bonding process, the bond wires are attached, one at a time, from each bond pad on the semiconductor device to a lead finger. The bond wires are generally attached through one of three industry-standard wire bonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts.

U.S. Pat. No. 4,862,245 issued Aug. 29, 1989, to Pashby et al. illustrates a so-called "leads over chip" arrangement ("LOC") on the semiconductor die. A plurality of lead fingers extend over the active surface of a semiconductor device toward a line of bond pads wherein bond wires make the electrical connection between the lead fingers and the bond pads. An alpha barrier such as a polyimide (for example, Kapton™) tape is adhered between the semiconductor die and the lead fingers. This configuration, which eliminates the use of the previously-referenced central die attach pad (die paddle), may assist in limiting the ingress of corrosive environment contaminants, achieve a larger portion of the lead finger path length encapsulated in the packaging material, and reduce electrical resistance caused by the bond wires (i.e. the longer the bond wire, the higher the resistance) and potential wire sweep problems aggravated by long wire loops. Clearly, such is in contrast to a conventional leadframe and semiconductor die wherein a larger semiconductor die cannot be encapsulated to form a smaller package assembly as the overall size of the conventional leadframe having lead fingers extending adjacent the semiconductor device governs the size of the encapsulated package.

The typical method for attaching the die to the lead fingers in an LOC configuration is to use an adhesive tape having a thermoplastic adhesive on both sides. The face of the die and the lead fingers are attached to the adhesive tape using heat and pressure. This process is expensive and complicated. The tape must be precisely attached to the lead fingers and die face so that the bond pads on the die face are not covered by the adhesive tape. In addition, different sizes of tapes and different tape punches must be used for each die size.

U.S. Pat. No. 5,286,679 issued Feb. 15, 1994, to Farnworth et al. and assigned to the assignee of the present invention illustrates a method for attaching a die to a leadframe comprising the steps of: forming an adhesive layer on a semiconductor wafer; patterning the adhesive layer to clear streets for saw cutting and to clear wire bond pads; separating the dice from the wafer; heating the adhesive layer; and attaching the lead fingers by pressing the lead fingers and die together. In an alternative embodiment, the adhesive layer is applied to the lead fingers of the leadframe rather than to the wafer. The adhesive used is either a thermoplastic adhesive, such as a polyimide, or a thermoset adhesive, such as a phenolic resin. Suggested methods for depositing and patterning the adhesive are: hot screen printing, cold screen printing, resist etch back, and photo-patterning. One problem with such a method is that the adhesive layer is applied and patterned to all dice on a wafer prior to sawing. It is not unusual for the yield rate in die production to be low. Therefore, adhesive is applied to many dice that are already known to be defective after the probe testing thereof or that will be subsequently rejected after singulation due to a failure to meet acceptable performance criterion. This results in material waste and decreased efficiency. Alternately, the '679 patent discloses the application and patterning of adhesive after the dice have been singulated. However, such requires the adhesive to be applied and subsequently patterned, rather than adhesive applied in a predetermined pattern to the singulated die in a single step.

In addition, it is difficult to rework or fix a die after the lead fingers have been attached to the die face if a thermoplastic or thermoset adhesive has been used. If a thermoset adhesive was used, the lead fingers are permanently attached to the die face. If a thermoplastic adhesive was used, it is necessary to reheat the die and leadframe at a substantially elevated temperature. Alternately, the adhesive has been applied to the lead fingers of the leadframes which have been subsequently bonded to the active surface of the semiconductor device before testing of the semiconductor device has been completed, thereby making it difficult or impossible to rework the semiconductor device if found to be defective during testing.

Thus, it would be advantageous to develop a process for packaging semiconductor devices that would reduce process steps and reduce material waste.

SUMMARY OF THE INVENTION

The present invention relates to a method for attaching a singulated semiconductor die or batches of singulated semiconductor dice to a leadframe by applying a liquid or paste mixture of unreacted monomers or polymers or a diluted resin deposited in a predetermined pattern on the die face, the leadframe, or both, after the semiconductor die has been separated from the wafer and tested sufficiently before or after separation to be referred to as a good die.

The method of the present invention comprises the steps of separating individual dice from a wafer; testing the dice or, optionally, separating dice probe tested and found to be acceptable; applying adhesive in a predetermined pattern to the good die or expected to be good dice from the testing thereof; and attaching the leadframe to the dice, either a die singly or in batches of singulated dice. An intermediate curing step may be used prior to attaching the leadframe to the dice. A post cure step may also be used after the leadframe has been attached to the dice. The adhesive is applied in a predetermined pattern to the die face or the lead fingers of the leadframe or both. In addition, the adhesive is applied as a wet film. Therefore, it is possible to remove the leadframe from the die for reworking if the die is subsequently determined to be bad. Because the adhesive is applied only to good dice determined from the testing thereof, time and material are saved as opposed to a process that applies adhesive to all dice in a wafer or to singulated dice wherein the adhesive is first applied to the dice and patterned thereafter.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
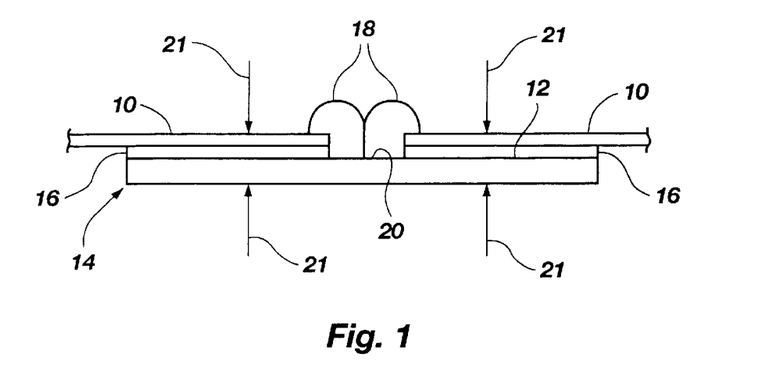
FIG. 1 is a side view of a semiconductor device which illustrates a semiconductor device produced with the method of the present invention.
Figure 2:
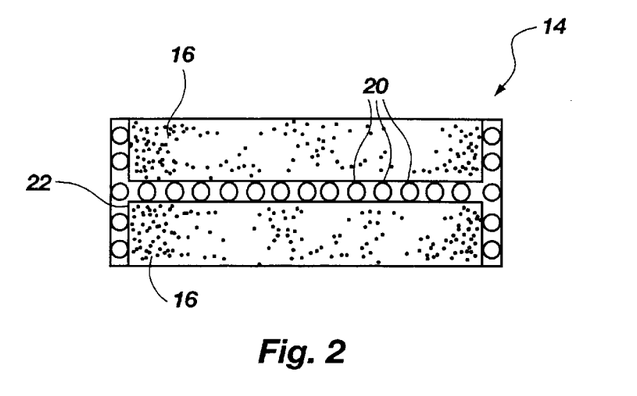
FIG. 2 is a top view of a semiconductor die coated with an adhesive layer in accordance with the method of the present invention.
Figure 3:
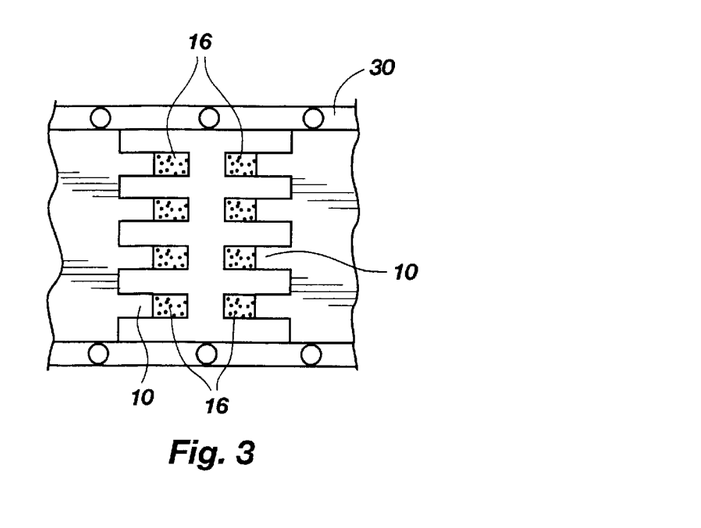
FIG. 3 is a bottom view of a leadframe with the lead fingers coated with an adhesive layer in accordance with the method of the present invention.

As illustrated in drawing FIGS. 1 through 3, the lead fingers 10 of a leadframe 30 have been secured to the active surface 12 of semiconductor device 14 using a wet film adhesive 16 in accordance with the method of the present invention. The leadframe 30 is electrically connected to the semiconductor device 14 by lead wires 18 (wire bonds) which connect the bond pads 20 on the active surface 12 of the semiconductor device 14 to the lead fingers 10 of the leadframe 30.

Generally speaking, the method of the present invention involves the following steps:

1. Identifying individual dice known to be good or acceptable for the intended usage thereof while still in wafer form.
2. Separating identified good dice individually from the wafer.
3. Further identifying the individual dice that meet acceptable performance criteria (good die), if necessary, to the extent necessary to identify the individual dice.
4. Applying an adhesive in a predetermined pattern to the active surface of the identified good die, the lead fingers of the leadframe, or both.
5. Attaching the lead fingers of the leadframe to the active surface of the identified good die.

After the dice have been removed from the wafer, the next step is to identify the individual dice that meet acceptable performance criteria (good die). Identifying good dice involves using any of the well-known testing methods. Preferably, the dice are initially tested when in wafer form using well-known probe testing techniques in the industry. The dice are removed from the wafer after such probe testing, being subsequently tested individually, if desired, or if probe testing cannot determine all the desired information from the dice, because of the ease of testing an individual die as opposed to the difficulty of probe testing the dice of an entire wafer. After testing a die, it is either moved on for further processing if it is good, or discarded or sent for reworking if it is bad. In this manner, valuable process time, adhesives, insulation tape, leadframes, and encapsulation material are not wasted on dice that are bad.

Figure 4:
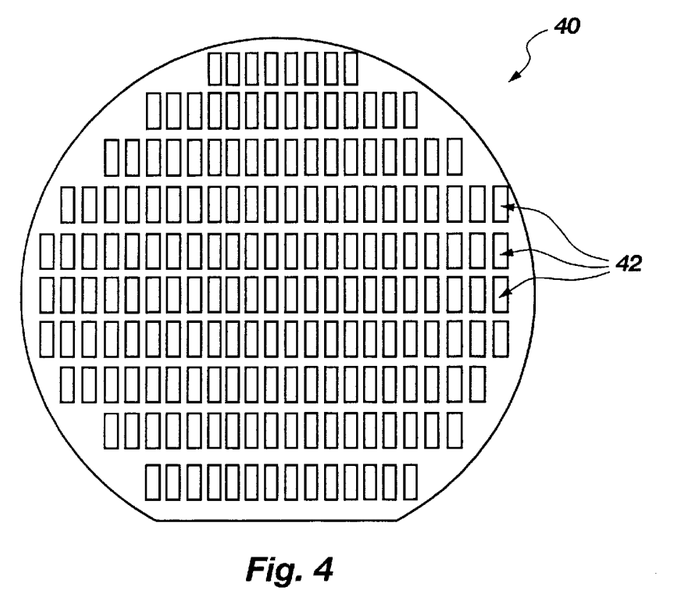
FIG. 4 is a top view of a semiconductor wafer.
Figure 5:
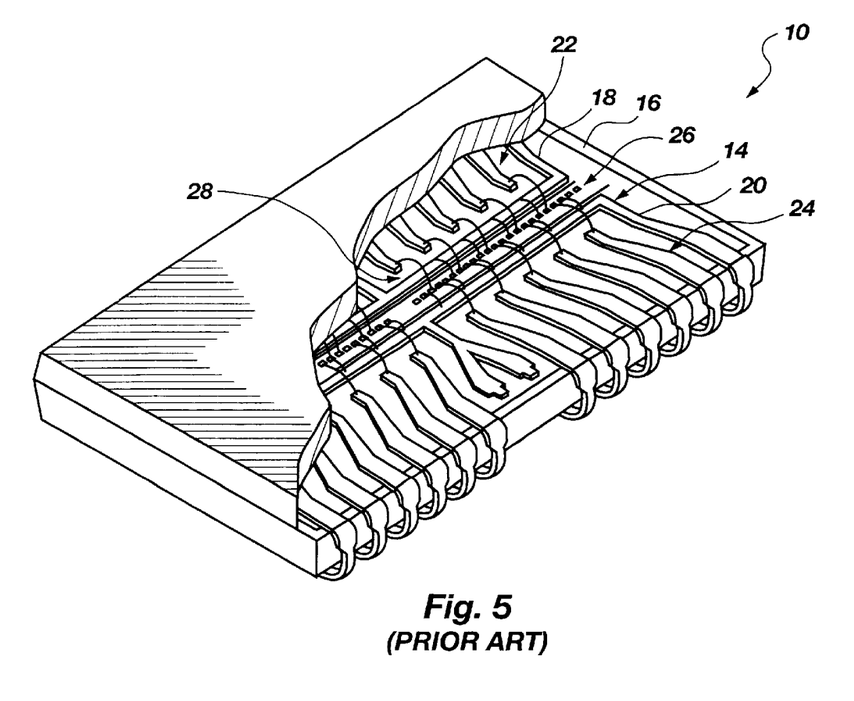
FIG. 5 is a perspective view, partially broken away, of a conventional packaged semiconductor device using a LOC type configuration.

In the first step of the method of the present invention, a semiconductor wafer is diced to separate or remove individual dice from the wafer, the wafer typically being diced by sawing. As illustrated in drawing FIG. 2, a semiconductor device (die) 14 has been removed from a semiconductor wafer. The semiconductor wafer 40, as shown in drawing FIG. 4, contains a plurality of semiconductor devices (dice) 42. Frequently, yield rates in semiconductor device production are quite low because defects in the individual die hinder the ability of a die to reach acceptable performance standards set by the customer while the die may be capable of meeting some performance standards. Processing the dice while in the wafer state results in a tremendous waste of time and material because many of the dice may be subsequently rejected due to failure to meet acceptable performance criteria.

After the dice have been tested and the good dice have been identified, the good dice are then placed in a fixture either singularly or in groups for processing. The good dice are aligned in the fixture to match the dice sites of the leadframe to which they will be attached and connected.

The next step of the present invention involves applying an adhesive 16 in a predetermined pattern on the active surface 12 of a good die 14. Alternately, the adhesive may be applied in a predetermined pattern to the lead fingers 10 of a leadframe 30 or both to the active surface 12 of a good die 14 and the lead fingers 10 of a leadframe 30. As illustrated in drawing FIG. 2, the active surface 22 of a good die 14 is selectively coated with the adhesive 16 in a predetermined pattern using any well known technique, such as screen printing, roll-on, spray-on, stencil, etc. In screen printing, the adhesive is applied with a squeegee through a fine screen mesh that is coated in various areas to define the desired application pattern. In a roll-on technique, the adhesive is transferred to a soft, grooved roller and then onto the surface. In spray-on applications, the adhesive is sprayed onto the surface in the desired pattern using a spray gun. A stencil may be used to obtain the desired pattern or non-application areas may be masked to prevent application of the adhesive.

Alternatively, as illustrated in drawing FIG. 3, the adhesive 16 may be applied to the lead fingers 10 of the leadframe 30. The adhesive 16 is applied in a predetermined pattern such that the bond pads 20 and other desired areas are free from adhesive 16, as shown in drawing FIGS. 2 and 3. The adhesive 16 may even be applied to both the lead fingers 10 and the active surface 22 of the good die 14.

In addition, the active surface 22 of the good die may be coated with the adhesive 16 in-line on the die attacher by write dispensing, stamp pad transfer, screen printing, or syringe dispensing. In stamp pad transfer applications, the adhesive is applied to a negative of the desired adhesive pattern. A pad then transfers the desired adhesive pattern to the surface by first contacting the negative and then being stamped on the active surface of the good die. In syringe applications, a positive pressure is applied to a syringe containing the adhesive in order to extrude the adhesive onto the desired surface in the desired predetermined pattern on the good die. In-line application of the adhesive has the advantage of maintaining efficient production rates while minimizing the use of adhesive in a predetermined pattern on a good die.

The adhesive 16 is either a liquid or paste mixture of unreacted monomers or polymers or a diluted resin. The adhesive 16 may be of two kinds of chemical mixtures. First, a curing type contains solvent, monomers or intermediate polymers, and filler. Second, a drying type contains solvent, polymeric resin (pre-cured), and filler. In addition, the adhesive 16 may also be a combination of the two types. The filler is used to increase the thixotropic index and flowability, if desired or required. The filler also decreases the coefficient of thermal expansion (CTE) mismatch among the good die-adhesive-leadframe interfaces. The filler may be of any well known type such as fused or fumed silica. The solvent and filler determine the rheologic characteristics (form and flow) of the adhesive for various deposition techniques. For example, screen printing requires a higher thixotropy and a medium viscosity. As another example, the spray-on technique uses a medium thixotropy and a lower viscosity. Conventional adhesives suited for this application include polyimide or polyimide siloxane. In addition, snap (or fast) cure epoxies can be used to reduce cycle time.

The adhesive 16 is applied as a wet film in either a liquid or paste, the optimal thickness typically being between 8 microns and 200 microns. Because the good die 14 and leadframe 30 are attached by a wet film and before the adhesive 16 has cured, the leadframe 30 may be removed from the good die 14, subsequently for whatever reason after the attachment of the leadframe 30 thereto. Therefore, under the process of the present invention, if required, rework of good dice becomes easier and less expensive.

If necessary, an intermediate curing step may be used. After the adhesive 16 has been applied to the active surface 22 of the good die 14 or lead fingers 10 of the leadframe 30 and before the leadframe 30 is attached to the good die 14, the adhesive 16 can then be "B staged" or partially cured. A B-stage resin is a resin in an intermediate state of flow in a thermosetting reaction and is tacky and capable of further flow.

The next step involves combining the leadframe 30 and the good die 14. The leadframe 30 is attached to the good die 14 using any well known method, such as applying a force 21 to press the leadframe 30, adhesive 16, and good die 14 together, as shown in drawing FIG. 1.

If necessary, a post curing step may be utilized. The liquid layer of adhesive 16 may be cured or dried using ultraviolet (UV), infrared (IR), or conventional or temperature zone ovens. If a curing type adhesive is used, the monomers or intermediate polymers will react under external energies such as ultraviolet light or heat through chain polymerization and condensation. The chain polymerization reaction is preferred as the condensation reaction is susceptible to moisture attack because of potential voids and byproducts, such as water, formed inside the adhesive. If a drying type adhesive is used, the adhesive must be completely baked to drive out the solvent. If a snap (or fast) cure epoxy is used, a temperature zone oven may be employed.

Depending on application and manufacturing needs, an in-line drying or curing system may be used to improve efficiency and reliability. For example, a five and eight temperature zone oven can increase throughput and help reduce voiding.

For increased efficiency, the process of the present invention may be integrated into a die lamination process. This has the advantage of reducing required floor space, reducing the number of equipment pieces, reducing processing steps, and reducing the logistics control. The result is a reduction in capital expenditure and labor costs as well as increased throughput.

In a further embodiment, the present invention includes the following additional steps:

6. Identifying the good dice, now with attached lead fingers, that fail to meet acceptable performance criteria (bad die).
7. Removing the lead fingers from the active surface of the bad die.
8. Fixing or reworking the die.

After the lead fingers 10 of the leadframe 30 have been attached to the good die 14, the good die 14 may be tested again using any well known methods to identify dice that do not meet acceptable performance standards (bad die). If the die meets acceptable performance criteria, it is moved on for further processing. If the die does not meet acceptable performance standards as previously determined to be considered an acceptable die, it may be sent for reworking in an attempt to such acceptable performance standards. Because the good die 14 was directly attached to the lead fingers 10 of the leadframe 30 with a wet film adhesive 16 or an adhesive 16 that was only partially cured, the leadframe 30 may be removed from the unacceptable semiconductor device 14 for rework. In this manner, valuable process time is not wasted on dice that are bad.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed:

1. A method of attaching a semiconductor device having an active surface thereon to a leadframe having a plurality of leads comprising:

separating the semiconductor device from a semiconductor wafer;

identifying acceptable criteria of said semiconductor device;

identifying an acceptable semiconductor device having said acceptable criteria, applying an adhesive in a wet film state in the form of one of a liquid and paste in a predetermined pattern to portions of said active surface of said acceptable semiconductor device;

partially curing the adhesive from the wet film state to an intermediate tacky and flowable state: and removably attaching portions of the plurality of leads of the leadframe to the portions of the active surface of said acceptable semiconductor device using the intermediate partially cured tacky and flowable state of said adhesive.

2. The method of claim 1, wherein identifying acceptable criteria of said semiconductor device includes identifying acceptable criteria before said semiconductor device is separated from the semiconductor wafer.

3. The method of claim 1, wherein identifying acceptable criteria of said semiconductor device includes identifying acceptable criteria after said semiconductor device is separated from the semiconductor wafer.

4. The method of claim 1, further comprising:
testing said semiconductor device to determine if the acceptable criterion are included in said semiconductor device; and
applying an adhesive to only said acceptable semiconductor device after the acceptable semiconductor device has been tested, the adhesive being applied in a predetermined pattern on said active surface of said acceptable semiconductor device.

5. The method of claim 1, further comprising: curing the adhesive after attaching the leadframe to said acceptable semiconductor device.

6. The method of claim 1, further comprising:
identifying additional acceptable criteria of said acceptable semiconductor device attached to the leadframe;
testing said semiconductor device attached to said leadframe to determine if the additional acceptable criteria are present in said semiconductor device;
removing the leadframe attached to said acceptable semiconductor device from an said acceptable semiconductor device determined to be an unacceptable semiconductor device based on said testing, and
reworking the unacceptable semiconductor device.

7. The method of claim 1, wherein adhesive is applied to more than one separated semiconductor device at a time.

8. The method of claim 1, wherein said applying said adhesive includes:
screen printing the adhesive on the acceptable semiconductor device.

9. The method of claim 1, wherein said applying said adhesive includes:
roll-on of the adhesive on the acceptable semiconductor device.

10. The method of claim 1, wherein said applying said adhesive includes:
spray-on of the adhesive on the acceptable semiconductor device.

11. The method of claim 1, wherein said applying said adhesive includes:
write dispensing the adhesive on the acceptable semiconductor device.

12. The method of claim 1, wherein said applying said adhesive includes:
stamp pad transfer of the adhesive on the acceptable semiconductor device.

13. The method of claim 1, wherein said applying said adhesive includes:
syringe dispensing the adhesive on the acceptable semiconductor device.

14. The method of claim 1, wherein the adhesive is applied as a liquid.

15. The method of claim 1, wherein the adhesive is applied as a powder.

16. The method of claim 1, wherein the adhesive is applied as a powder on a wetted surface of said acceptable semiconductor device.

17. The method of claim 1, wherein the adhesive is applied as a paste.

18. The method of claim 1, wherein the leadframe is attached to said acceptable semiconductor device before the adhesive is cured to said intermediate state.

19. The method of claim 1, wherein the adhesive forms an adhesive layer that is between 8 microns and 200 microns.

20. The method of claim 1, further comprising:
applying the adhesive to lead fingers of the leadframe before attaching the leadframe to the acceptable semiconductor device.

21. A method of attaching a semiconductor device having an active surface thereon to a leadframe having a plurality of leads, comprising:
separating the semiconductor device from a semiconductor wafer;
identifying acceptable criteria of said semiconductor device;
testing said semiconductor device to determine if the acceptable criteria are included in said semiconductor device;
applying an adhesive in a wet film state in the form of one of a liquid and a paste in a predetermined pattern to said active surface of an acceptable semiconductor device after the acceptable semiconductor device has been identified;
partially curing the adhesive from the wet film state to an intermediate tacky and flowable state; and
removably attaching potions of the leads of the leadframe to said acceptable semiconductor device using the intermediate tacky and flowable state partially cured adhesive.

22. The method of claim 21, wherein said identifying acceptable criteria of said semiconductor device includes identifying acceptable criteria before said semiconductor device is separated from the semiconductor wafer.

23. The method of claim 21, wherein said identifying acceptable criteria of said semiconductor device includes identifying acceptable criteria after said semiconductor device is separated from the semiconductor wafer.

24. The method of claim 21, further comprising:
curing the adhesive after attaching the leadframe to said acceptable semiconductor device.

25. The method of claim 21, further comprising:
identifying additional acceptable criteria of said semiconductor device attached to the leadframe;
testing said semiconductor device attached to said leadframe to determine if the additional acceptable criteria are present in said acceptable semiconductor device;
removing the leadframe attached to said acceptable semiconductor device from said acceptable semiconductor device determined to be an unacceptable semiconductor device based on said testing; and
reworking the unacceptable semiconductor device.

26. The method of claim 21, wherein adhesive is applied to more than one separated acceptable semiconductor device at a time.

27. The method of claim 21, wherein said applying said adhesive includes:
screen printing the adhesive on the acceptable semiconductor device.

28. The method of claim 21, wherein said applying said adhesive includes:
roll-on of the adhesive on the acceptable semiconductor device.

29. The method of claim 21, wherein said applying said adhesive includes:

spray-on of the adhesive on the acceptable semiconductor device.

30. The method of claim 21, wherein said applying said adhesive includes:

write dispensing the adhesive on the acceptable semiconductor device.

31. The method of claim 21, wherein said applying said adhesive includes:

stamp pad transfer of the adhesive on the acceptable semiconductor device.

32. The method of claim 21, wherein said applying said adhesive includes:

syringe dispensing the adhesive on the acceptable semiconductor device.

33. The method of claim 21, wherein the adhesive is applied as a liquid.

34. The method of claim 21, wherein the adhesive is applied as a paste.

35. The method of claim 21, wherein the adhesive is applied as a powder.

36. The method of claim 21, wherein the adhesive is applied as a powder on a wetted surface of said acceptable semiconductor device.

37. The method of claim 21, wherein the leadframe is attached to said acceptable semiconductor device before the adhesive is cured to said intermediate state.

38. The method of claim 21, wherein the adhesive forms an adhesive layer that is between 8 microns and 200 microns.

39. The method of claim 21, further comprising:

applying the adhesive to lead fingers of the leadframe before attaching the leadframe to the acceptable semiconductor device.

40. A method of attaching a semiconductor device to a leadframe, comprising:

separating the semiconductor device from a semiconductor wafer;

identifying acceptable criteria of the semiconductor device;

identifying an acceptable semiconductor device;

applying a wet film adhesive in one of a liquid and a paste to portions of the lead fingers of the leadframe in a predetermined pattern;

applying an adhesive in a wet film state in one of a liquid and a paste to portions of the active surface of the an acceptable semiconductor device in a predetermined pattern;

partially curing the adhesive on said lead fingers and said acceptable semiconductor active surface from the wet film state to an intermediate tacky and flowable state; and removably attaching the leadframe to the acceptable semiconductor device.

41. The method of claim 40, wherein identifying acceptable criteria of said semiconductor device includes identifying acceptable criteria before said semiconductor device is separated from the semiconductor wafer.

42. The method of claim 40, wherein identifying acceptable criteria of said semiconductor device includes identifying acceptable criteria after said semiconductor device is separated from the semiconductor wafer.

43. The method of claim 40, further comprising:

curing the adhesive after attaching the leadframe to said acceptable semiconductor device.

44. The method of claim 40, further comprising:

identifying additional acceptable criteria of said acceptable semiconductor device attached to the leadframe;

testing said acceptable semiconductor device attached to said leadframe to determine if the additional acceptable criteria are present in said acceptable semiconductor device;

removing the leadframe attached to said acceptable semiconductor device from said acceptable semiconductor device determined to be an unacceptable semiconductor device based on said testing; and reworking the unacceptable semiconductor device.

45. The method of claim 40, wherein adhesive is applied to more than one separated acceptable semiconductor device at a time.

46. The method of claim 40, wherein said applying said adhesive includes:

screen printing the adhesive on the acceptable semiconductor device.

47. The method of claim 40, wherein said applying said adhesive includes:

roll-on of the adhesive on the acceptable semiconductor device.

48. The method of claim 40, wherein said applying said adhesive includes:

spray-on of the adhesive on the acceptable semiconductor device.

49. The method of claim 40, wherein said applying said adhesive includes:

write dispensing the adhesive on the acceptable semiconductor device.

50. The method of claim 40, wherein said applying said adhesive includes:

stamp pad transfer of the adhesive on the acceptable semiconductor device.

51. The method of claim 40, wherein said applying said adhesive includes:

syringe dispensing the adhesive on the acceptable semiconductor device.

52. The method of claim 40, wherein the adhesive is applied as a liquid.

53. The method of claim 40, wherein the adhesive is applied as a paste.

54. The method of claim 40, wherein the adhesive forms an adhesive layer that is between 8 microns and 200 microns.

55. The method of claim 40, wherein the adhesive is applied as a powder.

56. The method of claim 40, wherein the adhesive is applied as a powder on a surface of said acceptable semiconductor which has a wetting agent thereon.

* * * * *

UNITED STATES PATENT AND TRADEMARK OFFICE
CERTIFICATE OF CORRECTION

PATENT NO. : 6,017,776
DATED : January 25, 2000
INVENTOR(S) : Jiang et al.

It is certified that error appears in the above-identified patent and that said Letters Patent is hereby corrected as shown below:

In the specification,
Column 2,
Line 42, change "criterion" to --criteria--; and Column 5,
Line 15, change "predennined" to --predetermined--.

In the claims,
Claim 1, Column 6,
Line 60, after "and" insert --a--;
Line 61, change "said" (first occurrence) to --an--;

Claim 4, Column 7,
Line 14, change "criterion" to --criteria--;

Claim 6, Column 7,
Line 27, after "said" (first occurrence) insert --acceptable--;
Line 29, after "said" insert --acceptable--;
Line 31, delete "an";
Line 33, after "testing" change """ to --;--;

Claim 19, Column 8,
Line 7, after "microns" and before "." insert --thick--;

Claim 21, Column 8,
Line 23, change "said" to --an--;
Line 29, change "potions" to --portions--;

Claim 25, Column 8,
Line 45, after "said" insert --acceptable--;
Line 47, after "said" (first occurrence) insert --acceptable--;

Claim 38, Column 9,
Line 31, after "microns" and before "." insert --thick--;

UNITED STATES PATENT AND TRADEMARK OFFICE
CERTIFICATE OF CORRECTION

PATENT NO.    : 6,017,776
DATED         : January 25, 2000
INVENTOR(S)   : Jiang et al.

It is certified that error appears in the above-identified patent and that said Letters Patent is hereby corrected as shown below:

Claim 40, Column 9,
Line 42, delete entire line "identifying an acceptable semiconductor device;";
Lines 43-53, replace entire text with:

> --applying an adhesive to lead fingers of the leadframe in a
>     predetermined pattern;
> applying an adhesive to an active surface of the acceptable
>     semiconductor device in a predetermined pattern;
> curing the adhesive on said lead fingers and said acceptable
>     semiconductor device active surface to an intermediate
>     state; and--;

Line 54. Delete "removably";

Claim 45, Column 10,
Line 20, after "wherein" insert --said--;

Claim 46, Column 10,
Line 24, after "adhesive" insert --to said active surface of said acceptable semiconductor device--;

Claim 47, Column 10,
Line 28, after "adhesive" insert --to said active surface of said acceptable semiconductor device--;

Claim 48, Column 10,
Line 32, after "adhesive" insert --to said active surface of said acceptable semiconductor device--;

Claim 49, Column 10,
Line 36, after "adhesive" insert --to said active surface of said acceptable semiconductor device--;

Claim 50, Column 10,
Line 40, after "adhesive" insert --to said active surface of said acceptable semiconductor device--;

UNITED STATES PATENT AND TRADEMARK OFFICE
CERTIFICATE OF CORRECTION

PATENT NO.   : 6,017,776
DATED        : January 25, 2000
INVENTOR(S)  : Jiang et al.

It is certified that error appears in the above-identified patent and that said Letters Patent is hereby corrected as shown below:

Claim 51, Column 10,
Line 44, after "adhesive" insert --to said active surface of said acceptable semiconductor device--;

Claim 54, Column 10,
Line 53, after "microns" and before "." insert --thick--; and Claim 56, Column 10,
Line 58, after "conductor" insert --device--.

Signed and Sealed this

Nineteenth Day of June, 2001

*Attest:*

*Attesting Officer*

NICHOLAS P. GODICI
*Acting Director of the United States Patent and Trademark Office*